United States Patent

Seiichiro

[11] Patent Number: 5,159,946
[45] Date of Patent: Nov. 3, 1992

[54] OVER-FLOW TANK FOR A SEMICONDUCTOR WAFER WASHING APPARATUS

[76] Inventor: Aigo Seiichiro, 3-15-13, Negishi, Daito-ku, Tokyo, Japan

[21] Appl. No.: 517,833

[22] Filed: May 2, 1990

[30] Foreign Application Priority Data

May 15, 1989 [JP] Japan .................. 1-55452[U]

[51] Int. Cl.⁵ ............................................... B08B 3/04
[52] U.S. Cl. ........................................ 134/182; 134/902; 137/574; 137/592; 454/63
[58] Field of Search .............. 134/902, 154, 155, 182, 134/186, 105, 108, 201, 64 R, 64 P, 122 R, 122 P; 156/345; 98/115.1; 68/181 R, 208; 422/292, 300; 137/574, 592; 354/324

[56] References Cited

U.S. PATENT DOCUMENTS

| | | | |
|---|---|---|---|
| 592,721 | 10/1897 | Barnhart et al. | 137/574 X |
| 1,976,879 | 10/1934 | Ewer | 137/574 X |
| 3,133,490 | 5/1964 | Buck | 354/324 X |
| 4,135,530 | 1/1979 | Cheney | 137/574 X |
| 4,325,394 | 4/1982 | Reams | 134/902 X |
| 4,361,163 | 11/1982 | Aigo | 134/902 X |
| 4,520,834 | 6/1985 | DiCicco | 134/902 X |
| 4,753,258 | 6/1988 | Aigo | 134/186 |
| 4,804,990 | 2/1989 | Jessop | 137/565 X |

FOREIGN PATENT DOCUMENTS

| | | | |
|---|---|---|---|
| 0123730 | 7/1983 | Japan | 156/345 |
| 0016427 | 1/1985 | Japan | 156/345 |
| 7907239 | 3/1981 | Netherlands | 68/181 R |

Primary Examiner—Philip R. Coe
Attorney, Agent, or Firm—Wegner, Cantor, Mueller & Player

[57] ABSTRACT

An over-flow tank for a semiconductor wafer washing apparatus includes a pair of opposed extensions integrally formed on a pair of opposed side walls of the tank. One of the extensions is provided with pipes and/or other devices. This form of attachment prevents formation of a stepped portion on which dust may accumulate. The extensions also act to guide the flow of clean air over the tanks, so that vapor formed in a chemical liquid tank in one row of such tanks is prevented from entering a pure water tank in an adjacent row.

7 Claims, 3 Drawing Sheets

OVER-FLOW TANK FOR A SEMICONDUCTOR WAFER WASHING APPARATUS

BACKGROUND OF THE INVENTION

1) Field of the Invention

This invention relates to an over-flow tank used in an apparatus for washing semiconductor wafers.

2) Description of the Prior Art

In a commonly accepted technique, a semiconductor wafer washing apparatus includes a plurality of washing tanks disposed in series which include a chemical tank containing liquid mixed with chemicals for initial washing, intermediate washing tanks, and a final washing tank containing pure water. Each of the washing tanks is surrounded by an over-flow tank so that the over-flow tank receives liquid over-flown from the washing tank and the liquid circulates through a pump and filter. Such a known washing apparatus is described in U.S. Pat. No. 4,520,834 to Dicicco. Although the known apparatus includes washing tanks and a frame for supporting and receiving the washing tanks, the top portions of the tanks and the frame are nearly the same in height. Accordingly, clean air introduced downward toward to the respective tanks will not be guided with any tank portions and thus clean air will scatter.

Also, a prior art over-flow tank provided with pipes and/or devices such as sensors, as shown in FIGS. 4 and 5, has its top margin of the level nearly identical to that of the washing tank located therein. Thus, one side wall of such over-flow tank is attached with an attachment plate with bolts or setscrews, and pipes for feeding or withdrawing chemicals and/or devices such as temperature sensor and level sensor are mounted on the attachment plate. Such a conventional over-flow tank has some drawbacks and problems as will be described below.

Since the conventional tank must be provided with the attachment plate on a side wall thereof, the attachment of the piece plate necessarily forms a stepped portion defining an upward-facing planar surface. This planar surface will undesirably tend to accumulate dust, thus lending to staining of the wafers. On the other hand, such washing apparatus is usually arranged in a clean room as seen in FIG. 6 and in the room each washing tanks are fed with clean air sent downwards from the ceiling through a filter and also through an opening formed in a cover. And, clean air flows over the washing tanks into a suction duct. Then, clean air sent on the washing tanks scatters, so that vapor formed in a tank included in the chemical tank row will flow transversely, that is, in crossing direction to the duct-oriented normal direction. Thus, the vapor will enter the final washing tank belonging to the next tank row. This influences the upper portion of wafers in the final washing tank, and will cause stain film on the wafer upper portion.

SUMMARY OF THE INVENTION

Therefore, an object of the invention is to solve the aforementioned drawbacks of the prior art, and accordingly to provide an improved over-flow tank for a semiconductor wafer washing apparatus, which obviates any portion on which dust will accumulate and prevents stain film on the wafers by means of guiding the clean air flow.

In attaining the above object, an over-flow tank for a semiconductor wafer washing apparatus according to the invention is arranged to surround a washing tank or tanks in which semiconductor wafers are washed and to receive washing liquid over-flown from the washing tank or tanks, said over-flow tank being fed with clean air sent downwards from the ceiling. The feature of the over-flow tank is that a pair of opposed side walls thereof are extended upwards over the top margin of the washing tank located therein, so that such extension of the side wall is adapted to be attached with pipes and devices needed and said pair of the extensions will guide the flow of clean air.

Thus, the over-flow tank of the invention does not need such a piece plate that is used in the prior art tank for attaching pipes and devices, and accordingly obviates the formation of any stepped portion on which dust will accumulate. Also, the pair of extended side walls serve to guide the clean air and to prevent the same from scattering over the tanks. This avoids influence of chemical vapor on wafers located in a pure water tank.

DETAILED DESCRIPTION OF THE PREFERRED EMBODIMENTS

Figure 1:
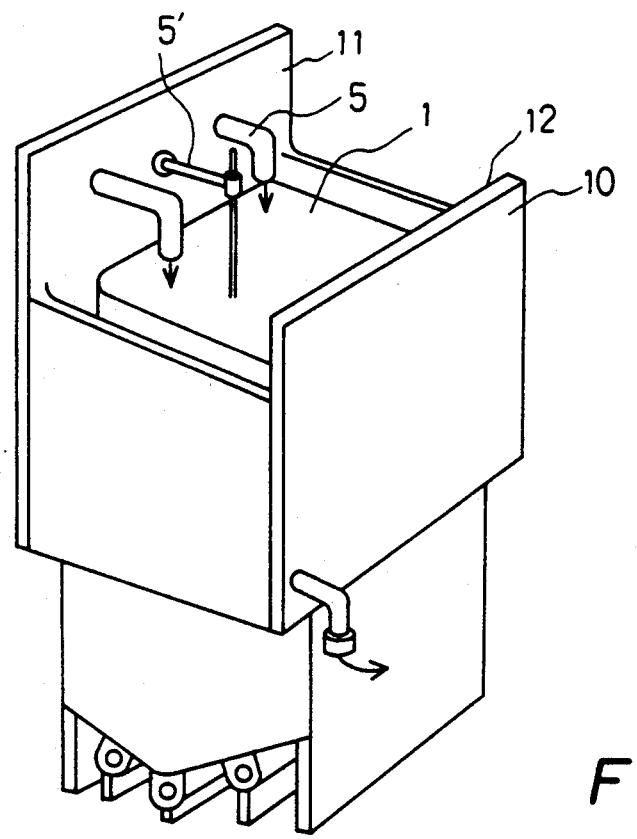
FIG. 1 is a perspective view showing an embodiment of an over-flow tank according to the invention.
Figure 2:
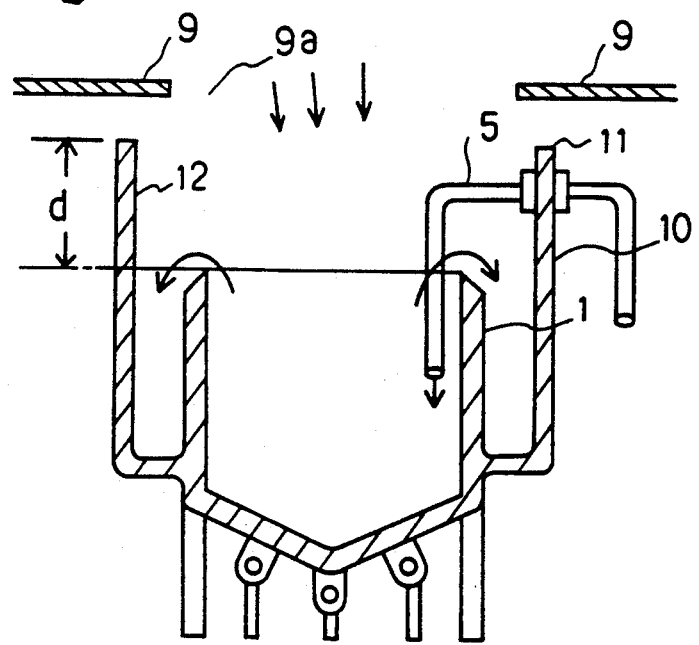
FIG. 2 is a vertical cross-sectional view of the embodied over-flow tank.

The invention will now be described with reference to the preferred embodiments. FIGS. 1 and 2 show an embodiment of the over-flow tank embodied by the invention, and as shown, an over-flow tank (10) of the invention surrounds a washing tank (1) and is adapted to receive washing liquid over-flown over the top periphery of the washing tank (1). This over-flow tank (10) is preferably formed integrally with the washing tank (1) located therein and made of fluororesin or quartz or other possible materials. Washing liquid which has flowed into the over-flow tank (10) circulates, as in the prior art, through a filter and a pump (not shown) and accordingly is introduced into the washing tank (10) through a port formed at the lower portion of the tank (10). Pure water or an aqueous solution including fluoric acid, hydrochloric acid or other chemicals may be used as washing liquids.

As shown in FIGS. 1 and 2, a pair of opposed side walls of the over-flow tank (10) are extended upward over the top margin of the washing tank (1) located within the over-flow tank (10). Namely, the over-flow tank (10) has a pair of vertical straight extensions (11) and (12) on the top of a pair of opposed side walls thereof. These extensions (11) and (12) have usually an extra height (d) of 50–70 mm over the top periphery of the washing tank (1). The respective extensions are integrally formed with the over-flow tank (10). Since the respective extentions (11) and (12) serve to guide clean air fed down onto the washing tanks (1), they are formed on a pair of side walls parallel to the flow direction of the clean air, and are preferably the same in height. Additionally, numeral (9) in FIG. 2 denotes a cover desirably provided above the washing tanks (1) when two or more tanks are placed side by side, and (9a) is an opening in the cover through which clean air is introduced onto the tanks (1).

Also, as seen in FIGS. 1 and 2, at least one of the extensions, for example, extension (11) will be provided with a pipe or pipes (5) for feeding chemicals into washing tank (1) and one or more devices (5') such as a thermometer and a level sensor or the like. Accordingly, either extension (11) or (12) will serve as a conventional piece plate (3) shown in FIG. 4.

Figure 3:
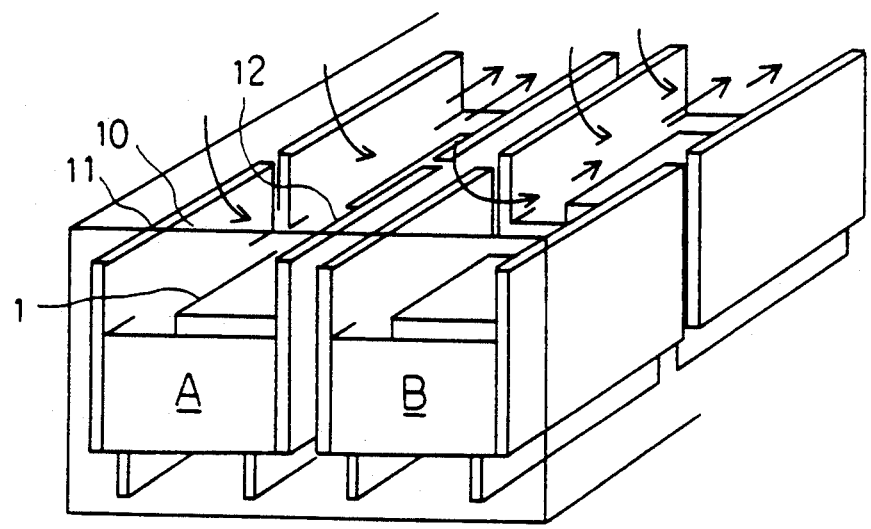
FIG. 3 is a perspective view of a washing apparatus including a plurality of over-flow tanks embodied by the invention.
Figure 4:
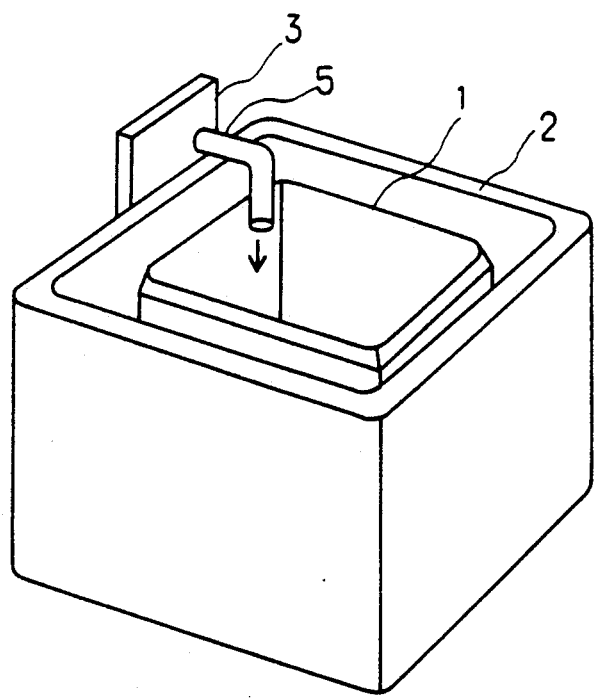
FIG. 4 is a perspective view a prior art over-flow tank.
Figure 5:
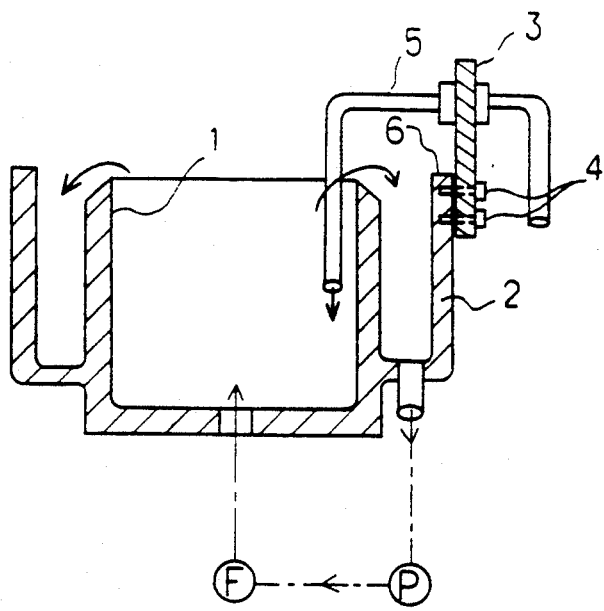
FIG. 5 is a vertical cross-sectional view of a prior art over-flow tank.
Figure 6:
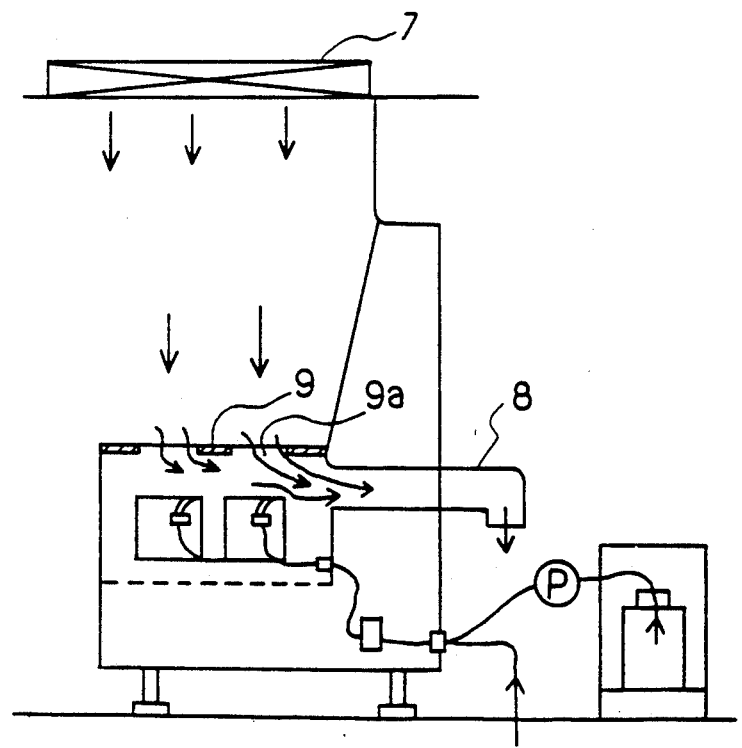
FIG. 6 is a schematic sectional view of a clean room and a washing apparatus set in the room.

Since, as described above, the over-flow tank (10) according to the invention is provided with the extensions (11),(12) on a pair of its side walls and one of the extensions will be attached with pipes or the like, the conventional attachment plate (3) (FIGS. 4 and 5) is not needed, and therefore any stepped portion is not provided. Also, a washing apparatus has a plurality of rows (A), (B) including over-flow tanks and washing tanks provided therein as shown in FIG. 3. Washing tanks (1) belonging to one of the rows contain liquid including some chemicals, and washing tanks (1) belonging to the other row contain pure water without any chemicals. As shown in FIG. 6, clean air is introduced in blowing port and from the ceiling of the clean room through a filter (7), onto the respective rows of tanks, and to a duct (8). In the process, clean air flows between a pair of opposed extensions (11),(12) of the over-flow tank (10). In other words, such extensions will guide the flow of clean air. On the other hand, in the prior art over-flow tank (2) as shown in FIGS. 4 and 5, because a piece plate (3) is mounted on a side wall with setscrews (4) and thus pipes (5) and necessary devices are attached to the plate (3), dust or particle will be accumulated on the top face (6) of the over-flow tank (2) and also clean air will scatter because of no guide for clean air.

According to the invention, clean air is guided with the mentioned extensions (11),(12), and therefore does not scatter on the tanks. Accordingly, clean air flowing along a row of tanks is prevented from entering another row of tanks, and thus vapor formed in a tank including liquid with chemicals is also prevented from entering the pure water tanks. Although in the shown enbodiments the resp over-flow tanks (10) include only one washing tank (1), the over-flow tanks (10) may also include a pair of washing tanks (1).

In the over-flow tank of the invention, no piece plate for mounting pipes or the like is needed, which obviates an area on which dust will be accumulated, and no stain will occur on semiconductor wafers after washing. In addition, because the flow of clean air fed onto the washing tanks is guided and is prevented from scattering on the tanks, wafers washed in pure water tank will not be influenced by vapor formed in chemical liquid tank disposed in the next row. This prevents wafers from being formed with a stain film thereon.

Having now fully described the invention, it will be apparent to one of ordinary skill in the art that many changes and modifications can be made thereto without departing from the spirit or scope of the invention as set forth herein.

What is claimed is:

1. An over-flow tank for use in a semiconductor wafer washing apparatus wherein clean air is forced over the tank to remove vapor formed therein, said over-flow tank comprising:
   a bottom surface;
   a first pair of opposed side walls having a first height;
   a second pair of opposed side walls having the first height, wherein said bottom surface, said first pair of opposed side walls, and said second pair of opposed side walls define a cavity;
   means for guiding the clean air over the over-flow tank in a direction parallel to said first pair of opposed side walls, said means comprising a pair of vertical extensions formed integrally and coplanar with said first pair of opposed side walls and each extending to a height greater than said first height; and
   at least one washing tank disposed within said cavity and formed integrally with said bottom surface, wherein said at least one washing tank has a height no greater than said first height.

2. An over-flow tank as claimed in claim 1, wherein said pair of vertical extensions both have a second height greater than said first height.

3. An over-flow tank as claimed in claim 1, wherein one of said pair of vertical extensions is adapted to be provided with hardware including pipes and monitoring devices.

4. An over-flow tank as claimed in claim 1, wherein said washing tank is made of fluororesin.

5. An over-flow tank as claimed in claim 1, wherein said washing tank is made of quartz.

6. A semiconductor wafer washing apparatus adapted to be placed in a clean room having means for forcing clean air onto the washing apparatus, said washing apparatus comprising a plurality of overflow tanks disposed in plural rows, wherein each of the overflow tanks comprises:
   a bottom surface;
   a first pair of opposed side walls having a first height;
   a second pair of opposed side walls having the first height, wherein said bottom surface, said first pair of opposed side walls, and said second pair of opposed side walls define a cavity adapted to hold a washing tank; and
   means for guiding the clean air over the over-flow tank in a direction parallel to said first pair of opposed side walls, said means comprising a pair of vertical extensions formed integrally and coplanar with said first pair of opposed side walls and each extending to a height greater than said first height;
   wherein the means for guiding the clean air of each over-flow tank in one of said plural rows are aligned so as to guide the clean air in a single direction.

7. An over-flow tank as claimed in claim 1, including a pair of said washing tanks disposed within said cavity.

* * * * *

UNITED STATES PATENT AND TRADEMARK OFFICE
CERTIFICATE OF CORRECTION

PATENT NO.  : 5,159,946
DATED       : November 3, 1992
INVENTOR(S) : Seiichiro AIGO It is certified that error appears in the above-identified patent and that said Letters Patent is hereby corrected as shown below:

On the title page:

Item 19, change "Seiichiro" to --AIGO--

Item 76, change "Aigo Seiichiro" to --Seiichiro AIGO--

Signed and Sealed this

Sixteenth Day of November, 1993

Attest:

BRUCE LEHMAN

*Attesting Officer*    Commissioner of Patents and Trademarks